United States Patent [19]

Boxman et al.

[11] Patent Number: 4,645,895

[45] Date of Patent: Feb. 24, 1987

[54] METHOD AND APPARATUS FOR SURFACE-TREATING WORKPIECES

[75] Inventors: Raymond L. Boxman; Shmuel Goldsmith, both of Herzliya; Nissan Brosh, Petah Tikva; Shaul Shalev, Ganei Yehuda; Hanan Yaloz, Ramat-Gan, all of Israel

[73] Assignee: Ramot University Authority for Applied Research & Industrial Development, Tel Aviv, Israel

[21] Appl. No.: 719,308

[22] Filed: Apr. 3, 1985

[30] Foreign Application Priority Data

Apr. 12, 1984 [IL] Israel ........................................ 71530

[51] Int. Cl.⁴ ............................................... B23K 9/04
[52] U.S. Cl. .................... 219/76.13; 118/50.1; 118/623; 118/625; 219/76.16; 427/37
[58] Field of Search ............ 427/37; 219/76.13, 76.14, 219/76.16, 121 R, 76.15; 118/50.1, 620, 623, 625

[56] References Cited

U.S. PATENT DOCUMENTS

| | | | |
|---|---|---|---|
| 1,162,149 | 11/1915 | Eckhardt | 427/37 |
| 3,461,268 | 8/1969 | Inoue | 219/76.13 |

FOREIGN PATENT DOCUMENTS

| | | | |
|---|---|---|---|
| 43-11372 | 5/1968 | Japan | 427/37 |
| 51-89834 | 8/1976 | Japan | 219/76.13 |
| 59-38373 | 3/1984 | Japan | 118/50.1 |
| 707714 | 1/1980 | U.S.S.R. | 219/76.14 |

*Primary Examiner*—Clifford C. Shaw
*Attorney, Agent, or Firm*—Benjamin J. Barish

[57] ABSTRACT

A method of surface-treating a workpiece is described characterized in applying one or more short-duration electrical pulses to produce, for each pulse, a high amplitude short-duration electrical discharge between the workpiece, serving as an anode, and another material serving as a cathode, while the workpiece and cathode are in a vacuum ambient. The workpiece and cathode are spaced from each other by a gap which is less than the smallest dimension of the cathode in the plane therethrough parallel to the workpiece.

37 Claims, 14 Drawing Figures

METHOD AND APPARATUS FOR SURFACE-TREATING WORKPIECES

BACKGROUND OF THE INVENTION

The present invention relates to methods of surface-treating workpieces, such as to produce metallurgical coatings, surface alloys, surface heat treatments, or surface etching of the workpieces by sputtering.

A known method for applying surface coatings to workpieces is based on the vacuum arc deposition technique. In this known technique, an electrical discharge is produced between two conducting electrodes in a vacuum ambient, the conduction of the electrical current being by means of a plasma consisting primarily of ionized and neutral species of the electrode material produced by the action of the arc itself at the surface of the electrodes. The presently known techniques are generally based on the application of direct current of low amplitude, typically from 1 to 300 amps and generally use geometries in which the workpiece or substrate is located relatively far from the source or cathode in order to obtain a relatively uniform coating. Such arrangements result in low deposition rates, and therefore the duration of the arcing is usually quite long, typically minutes or hours, in order to produce a coating of significant depth, e.g. at least a few microns. Under these circumstances, heating of the workpiece surface is limited, and the thermal diffusion length is usually large in comparison with the workpiece thickness; the excess heat is usually removed from the workpiece by conduction through the workpiece support, with or without assistance of forced liquid cooling within the support.

BRIEF SUMMARY OF THE INVENTION

An object of the present invention is to provide a new method of surface treating a workpiece having advantages over the known vacuum arc deposition techniques.

According to a broad aspect of the present invention, there is provided a method of surface treating a workpiece, characterized in applying one or more short-duration electrical pulses to produce, for each pulse, a high-amplitude short-duration electrical discharge between the workpiece, serving as an anode, and another material serving as a cathode, while the workpiece and cathode are in a vacuum ambient.

Preferably, the workpiece and cathode are spaced from each other by a gap which is less than the smallest dimension of the cathode in the plane therethrough parallel to the workpiece.

It will thus be seen that the novel method of the present invention differs from the conventional vacuum-arc deposition technique in a number of respects: (1) Whereas the known techniques generally operate with direct current of low amplitude, the novel technique of the present invention operates with high-amplitude, short-duration pulses; preferably, each pulse is applied for a half-amplitude, full-wave (HAFW) duration of 0.5 to 100 ms., and the electrical discharge has a current density of at least $3 \cdot 10^6$ amps/m$^2$, e.g., from 500–2000 amps. with practical-sized cathodes. (2) Further, whereas the conventional vacuum-operated technique uses a geometry in which the substrate is located relatively far from the source, in the present invention the substrate or workpiece is preferably located relatively close to the source or cathode, e.g., spaced therefrom by a gap less than the smallest dimension of the cathode; for example, when using cathodes of at least 10 mm. in diameter, the gap should be less than 8 mm., preferably from 1 to 4 mm. (3) In addition, because of the short duration of the arc pulse, the total energy delivered to the workpiece can be relatively low, and the thermal diffusion length can be made considerably less than the workpiece thickness.

A number of embodiments of the invention are described below for purposes of example. In some of the described embodiments, the material of the cathode is applied as a surface coating to the workpiece, the surface of the workpiece being heated by the electrical discharge above the melting point of the cathode material, but below the melting point of the workpiece material. In other described embodiments, the material of the cathode is applied as a surface coating to the workpiece, the surface of the workpiece being heated by the electrical discharge sufficiently to promote interdiffusion of, and thereby adhesion between, the workpiece and the cathode coating. In a further described embodiment, the material of the cathode is applied as a surface coating to the workpiece, the surface of the workpiece being heated by the electrical discharge above the melting point of the cathode material and of the workpiece material, thereby producing an alloy of the two materials on the surface of the workpiece. In a still further described embodiment, the surface of the workpiece is heated by the electrical discharge beyond its solid phase transformation temperature and then is allowed to rapidly cool through natural solid conduction into the bulk of the workpiece material, thereby quenching the regions near the surface of the workpiece to induce metastable crystalline structure.

Because the short duration of the arc pulse permits the thermal diffusion length to be considerably less than the workpiece thickness, the phase transformations can be confined to the region very close to the workpiece surface while the bulk termperature rise can be quite small.

THE DRAWINGS

The invention is herein described, for purposes of illustration only, with respect to a number of examples described below, and also with respect to the accompanying drawings, wherein.

Figure 1:
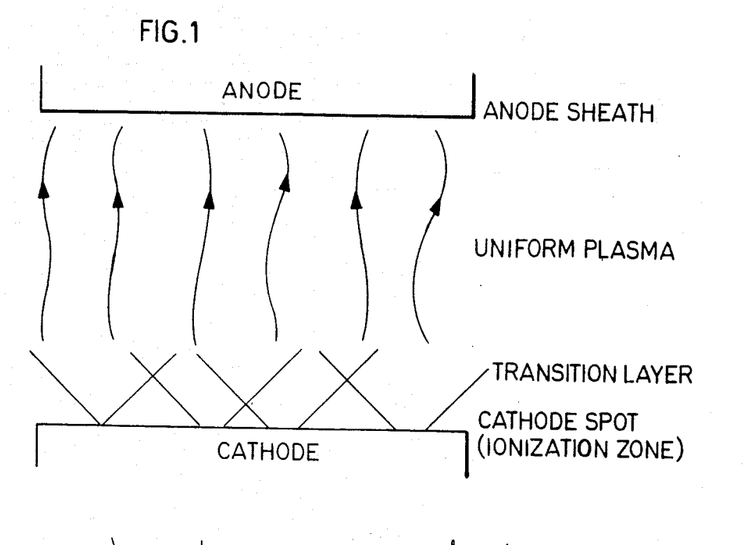
FIG. 1 is a diagram helpful in explaining the mechanism of action of the present invention.

MECHANISM OF ACTION (FIG. 1)

Before discussing the specific embodiments of the invention illustrated in FIGS. 2–7 of the drawings and also described in the examples set forth below, it is believed that the invention itself, and the advantages attainable by it, will be better understood by reference first to FIG. 1 of the drawings and the following discussion of the mechanism of action believed to be involved in the method of the present invention.

As schematically shown in FIG. 1, in a vacuum arc with a current of around 1 kA, the conducting medium between the cathode and anode is a plasma produced by a multitude of minute regions, known as cathode spots, at or near the cathode surface. The number of cathode spots present is proportionate to the current, with the proportionality constant dependant on the cathode material. High vapor pressure materials tend to have relatively low current per spot (e.g. 10–20 A for Cd), while more refractory materials have higher currents per spot (e.g. 150–200 A for Mo). Each cathode spot emits a plasma jet that is generally directed away from the cathode surface. The plasma jet is generally highly ionized and flows at high velocity. The parameters which characterize the plasma jet are dependent on the material. As an example, the Cu vacuum arc cathode spot jet is characterized by a practically totally-ionized flow: an average ionicity of the ions is 1.85; and average ionic velocity is $10^4$ m/s; and an ion current (directed away from the cathode) is about 8% of the total spot current.

"Ionicity" is the average degree of ionization of the ions in the plasma, and is given by the formula below:

$$Z = \sum_i i F i$$

where "i" is the degree of ionization, and "Fi" is the fraction of the total number of ions that are ionized "i" times. As an example, in the case of a Cu vacuum arc, the scientific literature reports that (F1, F2, F3)=(0.30, 0.55, 0.15), and hence the ionicity Z=1.85.

At some distance from the cathode surface, dependent on the density of cathode spots, the individual jets merge and form a quasi-uniform plasma flow region, with the general flow direction away from the cathode. In the simplest case illustrated in FIG. 1, if the arc anode is located close to the cathode, it intercepts this plasma flow; and depending upon the combination of materials, a certain fraction of the plasma may condense upon the anode surface, where in this case the anode serves as the coating substrate. For some choices of material combinations, the energetic ions bombarding the substrate cause the ejection of neutral atoms from the substrate, a process known as "sputtering". If the sputtering rate is too high, a coating will not form; this phenomena may be utilized for pulse etching the substrate surface. The ion flux to the anode/substrate surface can be estimated by the following expression:

$$G_i = fI/(e\,Z\,A) \qquad (1)$$

where "$G_1$" is the ion flux (number of ions per unit time per unit area), "f" is the ion current fraction (typically around 0.1), "I" is the arc current, "e" is the charge per electron, "Z" is the average ionicity of the plasma ions, and "A" is the cross section area of the discharge. In cases where the interelectrode gap is small compared to the cathode diameter, A may be taken as the area of the face of the cathode. If all of the ions condense on the substrate and form a coating, the coating rate can be calculated by the following expression:

$$V_c = G_i\, m_i/p = f I\, m_i/(e\,Z\,A\,p) \qquad (2)$$

where "p" is the density of the coating material and "$m_i$" is the ionic mass. As a numerical example, the coating rate expected from 1 kA Cu arc (f=0.08, Z=1.85) from a 12 mm diam cathode mounted close to an anode/substrate is calculated to be 26 microns per second. The total coating thickness $l_c$ can then be calculated by integrating eq. 2:

$$l_c = \int_0^T v_c(t)dt$$

where T is the arc duration

Concurrent with the flow of material, there is a flow of energy to the substrate surface. The major mechanisms of energy transport is the energy carried by the electrons and ions. Some lesser amount of energy transport may occur due to plasma radiation and macroparticle flux. The energy flux arriving at the substrate surface heats it. The energy influx is balanced primarily by heat conduction into the interior of substrate at low temperatures. If the surface is substantially heated, cooling by evaporation may also occur. Additional cooling may occur by radiation and emission of secondary particles. In the case of the simple geometry shown in FIG. 1, where the substrate serves as the arc anode and assuming a uniform arc, the energy flux to the anode surface may be calculated by the following expressions:

$$S = I V_e / A \qquad (3)$$

where $V_e$ is the anodic energy flux potential given by $$V_e = (1 + f)(2kT_e/e + V_w) = \qquad (4)$$

$$f \sum_i f_i(m_i v_i^2 2e - iV_a + V_i - iV_w + V_v)$$

where $T_e$ is the temperature of the electrons in the plasma, $V_w$ is the anodic work function, $V_a$ is the anode sheath potential (which is generally negative for a uniform vacuum arc, and equal to a few electron volts), $V_1$ is the energy required to ionize the atom to the i'th degree of ionization, $V_w$ is the vaporization energy, and $f_1$ is the fraction of ions ionized to the i'th degree of ionization. The first term in eq. 5 represents the electronic component of the energy flux, while the second term represents the ionic component. If the thickness of the substrate is large compared to the thermal diffusion time, the anode surface temperature may be estimated using the solution of the heat flow equation for semi-infinite solid:

$$T_a(t) = T_a(O) + \frac{\int_o^t [S_t(\tau)/\sqrt{t-\tau}\, d\tau}{K_{J1}\sqrt{\pi\mu\rho\tau}} \tag{5}$$

where $T_a(t)$ is the instantaneous anode surface temperature, $T_a(O)$ is the initial anode surface temperature, and $K_{J1}$ is Joule's constant (4.12 Joule/cal), $S_t(t)$ is the instantaneous total net heat flux at the surface, and consists of S(t) given in eq. (3), with corrections for cooling by evaporation, radiation, sputtering, etc. These latter effects are likely to be negligible during the initial phase of an arc if the initial temperature is near room temperature. Eq. (5) should be considered approximate, as it does not take into consideration ohmic heating in the bulk of substrate, phase changes in the substrate, nor the accumulation of material at the surface during the coating process. These latter effects are believed to be of secondary importance., however Eq. (5) yields the instantaneous anode surface temperature both during the arc pulse and thereafter. Examination of the equation, and numerical examples, indicate (1) peak anode surface temperature occurs after the current peak and (2) the characteristic cooling time of the anode surface is proportional to the heating time. The second conclusion leads to the important result that the quench time, which often must be short in order to perform transformations to metastable crystalline structures, can be made short by heating the anode with a short arc pulse.

Different forms of surface structures may be anticipated depending on the process parameters (current pulse amplitude, waveform, and duration, geometry, and materials) chosen. If the surface temperature remains below the recrystalization temperature (for both the substrate and coating materials) condensation from the plasma state may occur, and a quasi-amorphous (i.e. very small crystal (20–50 Å) may be produced. If the temperature is above the recrystallization temperature, larger crystal structures may be produced. If the temperature is sufficiently high so that material diffusion is appreciable for the materials utilized, there may be produced an interdiffusion layer between the coating and substrate, which may either enhance adhesion, by forming a good metallic bond, or impair adhesion if a brittle intermetallic compound is formed. Having the temperature exceed a solid phase transformation temperature, and cooling rapidly, may be used to induce the formation of metastable structures, such as Martensite in steels. Having the surface temperature exceed the melting temperature of either the substrate or the coating materials (taking into account the probable change in the melting point due to the contact with the second material), causing melting and and thereby the dissolution of the second material into the molten material, may be used to produce surface alloys. In all events, the techniques of the present invention can be used to produce modification of the structure due to the inclusion of macroparticles arriving at the substrate.

It should be pointed out that the above explanations of the mechanism of action are necessarily brief, and relate most particularly to the simple geometry shown in FIG. 1 when a uniform arc is present. Modifications are necessary for deviations from the ideal situation presented above. For example, if a ring anode and separate, electrically insulated, substrate is utilized, the electron flow to the substrate is reduced to a value equal to the ion flow, and substantially less heating will occur.

With the simple geometry of FIG. 1, there is a tendency at higher currents and large electrode gaps for a concentration of the arc to occur in the vicinity of the anode, leading eventually to anode spot formation. Naturally enhanced material and/or heat flows may be anticipated. This phenomen may be forestalled, however, by the imposition of an axial magnetic field having a magnitude comparable to the self magnetic field of the arc. While the above explanations relate most particularly to a "pure" vacuum arc, i.e. one in which the influence of any background gas is negligible, cathode spot jets are present in low pressure arcs as well, and thus the same principles would apply in modified form in the presence of an "alloying" gas, as to be described below particularly with reference to FIG. 3.

In the examples set forth below, there have been used currents ranging from 0.5 to 2.0 kA peak, on cathodes having a diameter of 12–14 mm. This can more appropriately be expressed in terms of average cathode current density ranging from $3\times10^6$ to $2\times10^7$ A/m$^2$. It is believed that with proper choice of geometry and magnetic field (in order to prevent constriction of the arc in the vicinity of the anode, or what is known as anode spot formation) the current range can be considerably extended, say to 200 kA, and still maintain the same principle effects, provided that the current density does not greatly exceed the range indicated. Although our experiments have used pulse durations ranging from 0.65 to 75 ms (HAFW), it is believed that the range of pulse duration can be extended in principle in both directions. In the short duration direction, the primary limitation will be the time required for the cathode spots to disperse over the cathode surface, though in some applications, where a concentrated coating or heating is required, even this might not be a limitation. In cases where a uniform dispersal of cathode spots is required, the arc duration should be greater than $D/(2v_{cs})$ where D is the cathode diameter and $v_{cs}$ is the propogation velocity of the cathode spots; or auxiliary means must be provided to ignite several cathode spots at various locations on the cathode surface. For Cu, $v_{cs}$ typically has values on the order of 100 m/s. Thus as an example, in order to insure a reasonably uniform cathode spot dispersal on a 12 mm Cu cathode, the arc duration would be greater than 60 $\mu$s. The fundamental limitation to minimizing pulse duration is the time required to ignite the vacuum arc. Recent research indicates that triggered vacuum arcs require times on the order of 200 ns to develop, while overstressed vacuum gaps can be ignited in times on the order of 20 ns. In all of these cases it should be kept in mind that the amount of material transferred, as well as the amount of heat delivered to the substrate, is dependent on the arc duration, and thus it is unlikely that extremely short duration pulses will find any utility for coating and surface treatment, except in very special circumstances. There is no fundamental limitation to extending the arc duration to longer periods. However to accomplish the objective of confining the heating of the substrate to its surface, the arc duration should be comparable to or less than the thermal diffusion time, which varies as $$\tau_d \alpha \rho c l/k \tag{6}$$

where $\rho$ is the substrate density, c is the heat capacity, l is the desired thermal penetration distance, and k is the thermal conductivity. If the pulse duration is such that the thermal diffusion length approaches the thickness of the substrate, then heat can be removed from the substrate by thermal conduction through its support, and the heat flow begins to approach steady state conditions. At this region in the arc duration, which will be dependent on the thermal properties of the substrate and its thickness, the processes involved become similar to those used in continuous vacuum arc coating operations. As an example, in a 1 cm thick Ni substrate, steady state heat flow conditions would be approached after approximately 4 seconds.

PREFERRED EMBODIMENTS OF THE INVENTION

Figure 2:
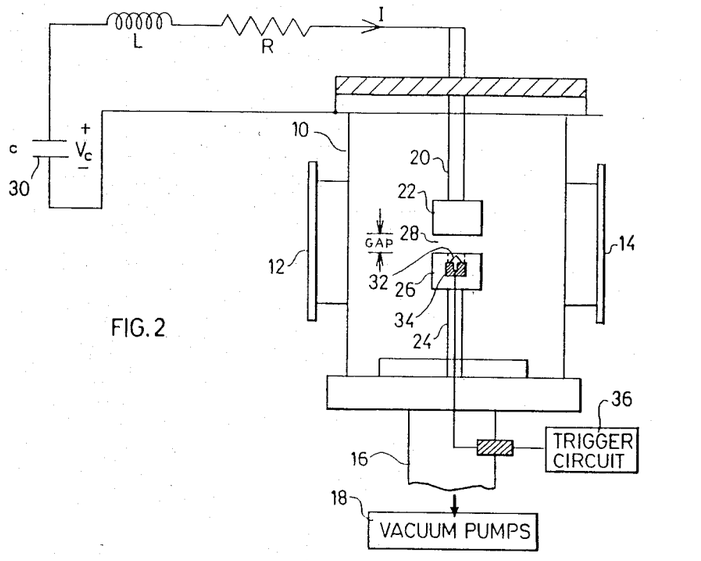
FIG. 2 schematically illustrates one form of apparatus constructed in accordance with the present invention.

FIG. 2 illustrates one form of apparatus that may be used for practicing the process of the present invention, and which was used in most of the examples described below.

Thus, as shown in FIG. 2, the apparatus comprises an arc chamber 10, e.g. of stainless steel, 160 mm. in diameter, equipped with ports 12 and 14 for access to, and visual observation of, the interior of the arc chamber. Chamber 10 is evacuated via a conduit 16 connected to a vacuum pump 18, e.g. an oil diffusion pump backed by a rotary mechanical pump. The vacuum ambient produced in chamber 10 during most of the tests to be described below were in the range of $4 \cdot 10^{-6}$ to $2 \cdot 10^{-5}$ Torr.

Disposed within arc chamber 10 is a mounting 20 for the workpiece or substrate 22, the latter serving as an anode, and another mounting 24 for the plasma source or cathode 26. In the illustrated example, cathode 26 is of annular configuration and is separated from the workpiece anode 22 by a gap 28 which is of smaller dimension than the smallest dimension of the cathode 26 in the plane therethrough parallel to the workpiece 22. For example, in any of the examples described below, the cathode has an outer diameter of 10 mm., and the gap 28 is less than 8 mm., being 1 mm in some examples and 4 mm in others.

The cathode 26 is grounded, and the anode 22 is connected by its mounting 20 to a high-current source consisting of a capacitor bank 30 connected to the workpiece via an inductance L and a resistance R. Generally, capacitance values from 48 to 384 mF were used, with charge voltages ranging from 50 to 250 volts. Resistor R of up to 200 mOhm and inductor L of up to 2 mH were used to shape the electrical current pulses.

The apparatus illustrated in FIG. 2 further includes a conical trigger electrode 32 located in a 2 mm. hole in the center of the annular cathode 26 and insulated therefrom by an insulator 34. Trigger electrode 32 is triggered by a trigger circuit 36. Application of high voltage to the trigger electrode 32 causes an electrical breakdown of the surface of the insulator 34 (e.g. glass), separating it from the cathode, forming a cathode spot on the cathode surface. Subsequent current flow in the trigger circuit produces plasma which fills the interelectrode gap 28, and eventually causes breakdown and current flow between the cathode 26 and the workpiece 22 serving as the anode.

Following are a number of specific examples in which the method of the present invention was practiced, using the apparatus illustrated in FIG. 2.

1. Aluminization of Steel.

A series of Al coating/surface-alloying procedures were performed using the apparatus shown in FIG. 2, and the following process parameters. Al cathodes from 12 to 14 mm in diameter were used as the source, and 1010 or 1010 free cutting steel, 25 mm in diameter and having thicknesses exceeding 1 cm were used as the substrate. The interelectrode gap was maintained at 4 mm.

In one sequence of tests with a 14 mm diameter Al cathode, all parameters were held constant except for the capacitor charge voltage, which influences primarily the peak arc current. All tests were performed with a capacitance value of approximately 0.4 F, inductance of approximately 2 mH, and series resistance, including stray components, of approximately 150 m-Ohm. The current waveform produced had a peak at approximately 30 ms after arc initiation, and a half-amplitude-full-width (HAFW) of 71 ms. The peak current and net mass change of the source ($\Delta M_c$) and substrate ($\Delta M_a$) after a single pulse with a given initial capacitor bank voltage are reported in Table 1. It might be noted that approximately ⅓ of the material lost by the source is deposited onto the substrate. All of the coatings so produced had a bright speckled appearance, the speckled nature presumably resulting from the inclusion of macroparticles into or onto the coatings. In tests with $V_c$ equal to or exceeding 175 V, the central portion of the substrate has a shiny appearance, indicative of the coating having exceeded its melting temperature during the arc cycle. The extent of this shiny region increased with increased charge voltage. Micrographic examination of a sectioned sample revealed structures indicative of melting of the Al coating, and surface alloying. Microhardness measurements performed in the regions of surface alloying indicated that the structures formed were harder than either ferrite or aluminum. Using Knopp indentor with a 10 g load, the microhardness of the ferrite and pearlite structures normal to 1010 steel far from the surface were 210 and 449 kg/mm², while the microhardness of selected areas of the surface alloy structure was 911 kg/mm². In the less central regions of the substrates a diffusion layer connects the coating layer with the substrate. In all regions the adhesion was good, i.e. it was not possible to flake off the coating with a needle.

TABLE I

| | Aluminization of Steel | | |
|---|---|---|---|
| $V_c$ (v) | $I_p$ (kA) | $\Delta M_c$ (mg) | $\Delta M_a$ (mg) |
| 150 | | −6.0 | +2.1 |
| 175 | 0.85 | −9.9 | +3.6 |
| 200 | 1.0 | −12.0 | +4.7 |
| 225 | 1.2 | −14.0 | +5.0 |

In another test, a sequence of 100 0.65 ms HAFW pulses were applied to a 14 mm Al source cathode and a 1010 steel substrate anode. Coating thicknesses of around 10 microns were observed, though there were indications that the coating material had melted and coalesced into a number of 0.1 to 1.0 mm globules in the central regions of the substrate. The coating adhesion was poor, as it could easily be flaked off.

2. Single Step Cementation and Quenching of Steel.

A conventional method of case hardening steel consists of placing the steel specimen in a carbon powder pack, heating for a long period of time (typically hours) in an oven to cause diffusion of the carbon into the workpiece, and then quenching in a separate operation to form a hard martensite structure. The process is lengthy, and the heating and subsequent rapid cooling of the entire workpiece can induce mechanical distortions and strains in the workpiece.

As an alternative, carbon can be surface alloyed into a steel substrate and quenched in a single pulsed vacuum arc. We have tested this concept with the following parameters. A 14 mm diam graphite cathode was used as the source and a 25 mm diam 1010 free cutting steel anode was used as the substrate. The electrodes were separated by a 4 mm gap. Using the same pulse circuit used in the first Al tests mentioned in paragraph A (0.4 F capacitor, 2 mm inductor, 150 m-ohm series resistance) with a charge voltage of 200 V, a 1 kA peak current, 73 ms HAFW current pulse results. Examination of the substrate indicates that substrate melting had occurred in the central regions. The entire substrate was coated with a black film, which could easily be flaked off. Metallagraphic examination of a cross section of the substrate indicates that the melted region had a Martensitic structure, indicating that carbon was dissolved into the molten region during the arc, and that rapid cooling of the molten region occurred. The microhardness of the martensitic region was measured using a Knoop indentor with a 25 g load to be 1050 Kg/mm$^2$ (roughly equivalent to 70 Rockwell C). It might be noted that under the surface alloy region evidence of solid phase transformations are noted as well. In the drawn 1010 free cutting sample used, the pearlite regions are normally organized into bands or chains running in the direction of the rod or draw axis. Close to the surface, however, the bands had a widened appearance, with the width increasing as the surface is approached. This effect is most noticeable in the center portions of the substrate. Presumably the temperature in these regions exceeded the austenizing temperature, and the carbon in the pearlite was dissolved and diffused laterally. With rapid quenching a pseudo-martensitic structure was formed.

3. Synthesis of Molybdenum Carbide - Molybdenum Surface Alloys.

A molybdenum carbide-molybdenum surface alloy was synthesized on the surface of a molybdenum substrate using the apparatus illustrated in FIG. 2. The same circuit parameters described in the previous section was used, with capacitor charge voltages of either 200 or 215 V. Measurements of the electrode weight change $\Delta M_c$ and $\Delta M_a$ of the cathode and anode, respectively, after a single arc pulse are presented in Table II. It should be noted that a certain amount of statistical variation is normal in arcing apparatus, dependent largely on the quality of the electrode material. The arc current waveform is similar to that mentioned earlier for other arcs using the same circuit (peak currents of around 1 kA, HAFW of around 70 ms). The source was a 14 mm graphite cathode, while the substrate was a 12 mm diameter Mo anode. Post arc examination indicated that the central region of the substrate had been melted, and that the entire substrate was coated with a black film. The black film could easily be scratched, but did not tend to flake off. Metallographic examination of a cross section of the sample indicated that the melted regions had a fine dendritic structure composed presumably of alternate bands of Mo and Mo$_2$C. The microhardness of the melted region was measured to be 600-700 kg/mm$^2$ (Knopp indentor, 25 g load), as compared to a microhardness of 321 kg/mm$^2$ in the Mo substrate far from the surface. In the 215 V test, a few isolated areas that were apparently pure Mo$_2$C were observed, having a microhardness of 1692 kg/mm$^2$.

An additional test was conducted with a charge voltage of 175 V. There were no signs of substrate melting. The substrate was coated with a film, black in color around the periphery, grayish in the center. The black region could easily be scratched, while the gray region was scratch resistant. Neither the grayish nor the black coating would flake off. The coating is apparently very thin (0.5 microns or less) as it could not be distinguished through optical microscopic observations on a metallographic section.

TABLE II

| | (molybdenum carbide synthesis) | |
|---|---|---|
| $V_c$ (u) | $\Delta M_c$ (mg) | $\Delta M_a$ (mg) |
| 175 | −1.72 | −0.34 |
| 200 | −2.93 | +0.51 |
| 215 | −2.14 | +0.82 |

4. Molybdenum Coating on a Copper Substrate

Molybdenum was coated onto Cu substrates using the apparatus shown in FIG. 2 and the following process parameters. The source was 12 mm diam Mo cathode, and the substrate was 25 mm Cu anode. The interelectrode gap was 1 mm. The discharge circuit parameters were C=0.4 F, L=1.9 mH, R=150 m-ohm. A single pulse with capacitor charge voltage of 200 V produced a smooth coating, that appeared to be very thin near the substrate periphery. The cathode lost 1.49 mg, while the anode gained 0.87 mg. There was no evidence to the naked eye of macroparticle defects (in contrast to Al vacuum arc coatings).

In an additional test a sequence of 10 arc pulses similar to the one described above was applied. The cathode lost 26.29 mg. while the anode gained 17.58 mg, indicating that the anode captured ⅔ of the material emitted from the anode. Metallographic examination indicated a smooth coating was produced, which followed the contours left on the substrate by machining. The coating was thickest near the center, having a thickness of approximately 10 micron.

Tests were also conducted using the same circuit and charge voltage, but with a larger gap (e.g. 4 mm). It was found that there would be some probability for most of the arcing to occur between the chamber wall, which was electrically connected to the cathode, and the anode support structure, and thus not producing a coating on the substrate face.

Tests were also conducted using a sequence of pulses with the following circuit parameters: C=0.2 F, L=0.17 mH, R=95 m-ohm. Pulses were produced having a peak current from 0.4 to 2.0 kA occurring 6 ms after arc initiation, and a HAFW of 16 ms. 12 mm diam Mo cathodes were used as sources, and 14 mm diam Cu anodes were used as substrates. Generally smooth, shiny, adherent coatings were produced, though detailed metallorgraphic examinations were not performed.

5. Tungsten Coating of Steel

Tungsten coatings on steel were prepared using a 14 mm sintered tungsten cathode source, and a 25 mm diam 1010 steel anode substrate. The circuit parameters were C=0.4 F, L=1.9 mH, and R=130 m-ohm. In one particular test a sequence of 19 pulses were applied, with a few minute pause between each pulse. Total charge transfer was 641 Couloubs. After coating the substrate had a matt gray appearance. The coating was concentrated in an annular region with a 3 mm inner diameter and a 21 mm outer diameter. We presume that the outer ring results from the lack of dispersal from the smaller cathode, and that the inner ring is the effect of the trigger hole in the cathode surface. The coating could be scratched, but there was no tendency to peel or flake. Metallographic examination of a cross section indicated that the coating was about 10 microns thick in the thicker regions. The coating appeared to be composed primarily of coelesced macroparticles, glued together perhaps by plasma condensation. We suspect that the multitude of macroparticles present in the coating is a direct result of the sintered construction of the cathode.

6. Sputter Etching of Steel in a Mo Arc

As was noted earlier, not every combination of source and substrate material produce coatings. In the case of a Mo source and a steel substrate, it was found that the anode substrate would lose mass during arcing, presumably due to sputtering caused by bombardment by the energetic Mo ions. As an example, applying a single arc pulse between a 12 mm diam Mo cathode source, and a 25 mm 1010 steel substrate with a gap of 4 mm, using the following circuit parameters (C=0.4 F, L=2 mH, R=130 m-ohm, $V_c$-175 V) a net mass loss of 0.25 mg is induced at the anode. This is equivalent to the removal of about 650 Å of the substrate surface, assuming that the sputtering was uniform over the substrate surface (whereas in fact it is most likely heavier in the center of the substrate) all within a single 70 ms HAFW pulse. This process could prove to be an effective way of sputter cleaning steel or other substrates prior to the application of other coatings, in order to provide a clean substrate surface upon which to coat.

7. Deposition of Ti and TiN

Coatings of TiN were prepared using the apparatus illustrated in FIG. 2, with a 14 mm diam Ti cathode, a 4 mm gap, and 24 mm diameter steel workpieces which were connected as anodes, and with the addition of a controlled background gas of low pressure nitrogen as an alloying gas in the vacuum chamber. In one set of experiments the arc circuit parameters were held constant (C=0.4 F., L=2 mH, R=150 m-ohm, Vc=200 V), while the pressure of the background gas was increased from test to test. It was found that for pressures less than 0.05 Torr no signs of TiN deposition were visually observed. However, at 0.1 Torr the outer rim of the workpiece was coated with TiN, which is readily identifiable by its distinctive gold color (in contrast to the natural white metallic color of Ti coatings produced at lower pressures). At a pressure of 0.3 Torr the lateral extent of the TiN coated region increased, forming an annular region in the outer 2-3 mm of the workpiece. Finally at a pressure of 1.0 Torr a gold TiN coating was observed over the entire face of the workpiece.

Subsequently various tests were conducted using 24 mm diam workpieces of 1010, 4340, and M42 (high speed) steels, capacitor charge voltages $V_c$ ranging from 160 to 200 V, nitrogen gas pressure in the range 0.7-1.3 Torr, and sequences of from 1 to 3 arcs, in some case with the first arc in the high vacuum regime ($2 \times 10^{-6}$ to $2 \times 10^{-5}$ Torr) in order to deposit a preliminary Ti coating. Some of these samples were subsequently examined metallurgically. Generally speaking the coating was not uniform, but rather could be differentiated into several concentric rings, each differing from its neighbor by a differing color tone, or texture. For the higher charge voltages surface melting of the substrate was often observed in the center of the workpiece. The coating closely followed the irregularities in the surface caused by the melting. The thickest coatings were also observed in the center, with thicknesses up to 5 microns observed, although generally speaking the coating was not uniform. Metallurgraphic observations of polished and etched samples revealed that in the center of the workpiece a shallow heat-effected zone could be observed, wherein the rapid heating and subsequent quenching by thermal conduction into the bulk of the workpiece caused hardening of the outer region (typically 0.1 mm) of the workpiece.

This method of high current arc deposition of TiN has several potential advantages over other methods currently practiced: (1) the deposition rate, up to 24 microns per second, is orders of magnitude higher than those obtained by other methods, potentially allowing vastly reduced processing time; (2) the treatment can be directed to selected portions of a workpiece; (3) the combination of coating and producing a hardened outer region of the workpiece may be advantageous in certain applications, as it has been reported in the scientific literature that a correlation exists between the hardness of the substrate and the adhesion of the coating; and (4) the pressure used in the new method (about 1 Torr) is considerably higher than that used in the presently practiced arc method, (about $10^{-3}$ Torr) allowing the use of simpler vacuum pumping and monitoring apparatus.

8. Miscellaneous Coatings (Examples 8-20)

A variety of other coatings have been produced using the process outlined in this disclosure, but detailed metallorgraphic examinations have not been performed. Some of the source-cathode substrate-anode combinations and the arcing conditions are listed in Table III.

TABLE III

| Example No. | Cathode | Anode | Ip (A) | HAFW (ms) |
|---|---|---|---|---|
| 8 | Mo | Al | 800-2000 | 16 |
| 9 | Cu | Al | 500-2000 | 16/2.5 |
| 10 | Cu | Zn | 400-1000 | 16/2.5 |
| 11 | Al | Cu | 500-2000 | 16/2.5 |
| 12 | Al | Zn | 500-1000 | 16/2.5 |
| 13 | Zn | Cu | 400-1500 | 16/2.5 |
| 14 | Zn | Al | 500-1500 | 16 |
| 15 | Cd | Cu | 500-2000 | 16/2.5 |
| 16 | Cd | Al | 500-2000 | 16/2.5 |
| 17 | Cd | Zn | 500-1000 | 16 |
| 18 | Cd | Steel | 1000 | 0.65 |
| 19 | Ni | Steel | 1080-1200 | 44-71 |
| 20 | Ni | Cu | 1000 | 70 |

Figure 3:
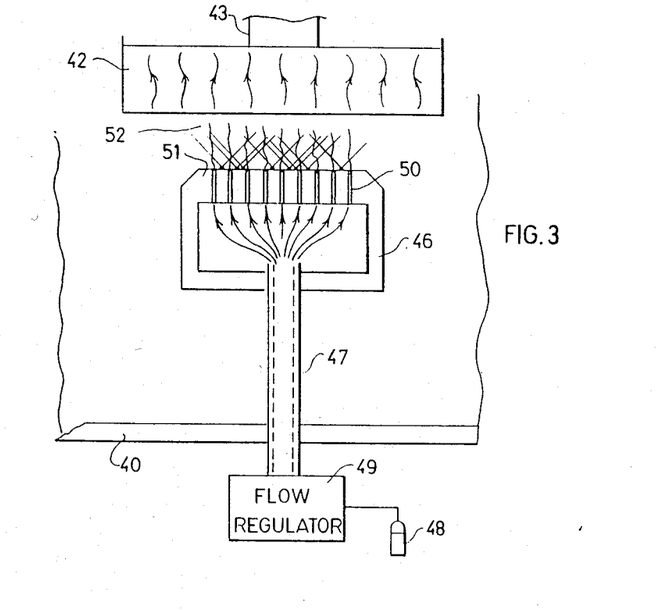
FIG. 3 illustrates another form of apparatus constructed in accordance with the invention for producing combined cathodic and gas plasma flow at high currents.

FIG. 3 illustrates an arrangement which may be used to provide an alloying gas in the vacuum ambient at the time of the electrical discharge, so as to produce a combined cathodic and gas plasma flow at high currents. Thus, the apparatus in FIG. 3 also includes an arc chamber, only the flange 40 of which is shown, for maintaining a vacuum ambient. In the vacuum are disposed the workpiece 42 serving as an anode supported by the anode support 43, and the cathode 46 having a hollow support 47 for conducting gas from a gas supply 48 located outside the chamber via a flow regulator 49. Cathode 46 is also of hollow construction and is formed with a plurality of oepnings 50 in its upper wall 51 through which the gas flows into the gap 52 between the cathode and the workpiece anode 42. Accordingly, there will be produced in gap 52 a combined cathode and gas plasma flow.

At the high arc currents involved in the method of the present invention, the cathodic ion flow has a tendency to sweep away and push out low pressure gas molecules. Therefore, the alloying gas from gas supply 48 should be introduced under high pressure along the discharge axis, and at a gas flow rate consistent with the stochiometric ratio desired at the workpiece anode 42, and the cathode ion emission rate.

For example, the workpiece anode 42 could be steel, the cathode could be titanium, and the gas from the gas supply 48 could be nitrogen, whereupon there would be produced a titanium-nitride coating on the steel workpiece.

Figure 4A:
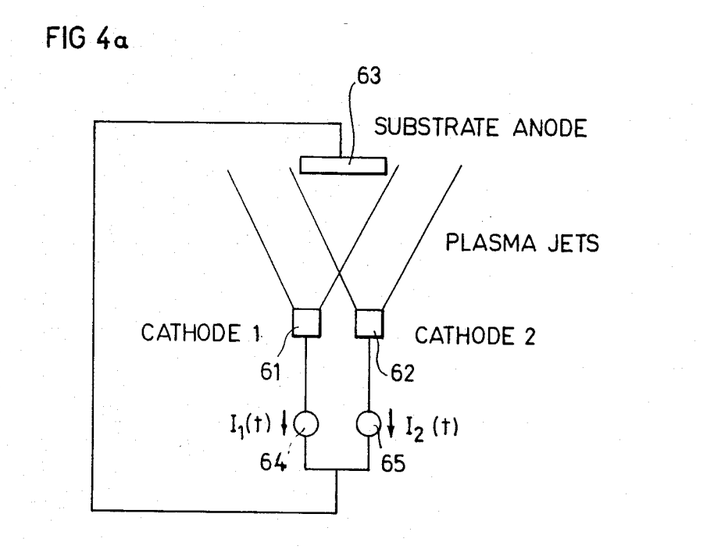
FIG. 4a illustrates another embodiment of the invention for producing from two (or more) cathodes a plurality of plasma beams which merge at the surface of the workpiece, e.g. for producing an alloy or graded coating thereon.
Figure 4B:
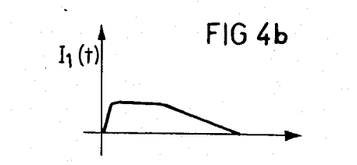
FIGS. 4b and 4c illustrate the current waveforms applied to the two cathodes.
Figure 4C:
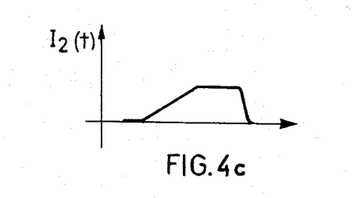
Figure 4D:
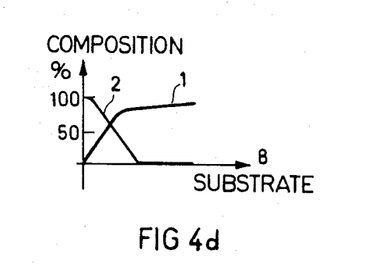
FIG. 4d illustrates the resultant deposits.

FIG. 4a illustrates a further arrangement which may be used, including a plurality (two being shown) of cathodes 61, 62, of different materials for producing a multicathode plasma with respect to the workpiece 63, serving as a common anode for all the cathodes. Each cathode is of a different material and is controlled from a separate current source 64, 65, respectively, having a different wave form as shown in FIGS. 4b and 4c, respectively. By thus continuously varying the ratio of the currents in the two cathodes, graded coatings are produced on the workpiece anode, as shown in FIG. 4d.

For example, the material of cathode 61 could be identical to the material of the workpiece 63, while cathode 62 could be of a material imparting some desirable protective qualities. As one example, the workpiece could be of steel, cathode 61 could also be of steel, and cathode 62 could be of aluminum.

Alternatively, cathodes 61 and 62 could be of two different materials to synthesize coatings on the workpiece anode 63, that might otherwise be difficult to produce. For example, one cathode may be of tungsten and the other may be of graphite to produce a tungsten carbide coating on the workpiece, e.g. steel.

Other possible applications of the technique and apparatus illustrated in FIGS. 4a–4d are as follows:

1. Synthesis of otherwise hard to fabricate materials, including carbides, e.g. boron carbide. It should be kept in mind that due to the rapid condensation from the plasma state metastable crystalline forms may occur, and thus this method may prove successful in the fabrication of the superconducting alloys, such as the A15 form of $Nb_3Si$, which have been postulated theoretically but have not been produced practically.
2. Production of graded coatings. In order to increase the adhesion of the coating, it may prove advantageous to initially coat the substrate with ions of the substrate material, and then during the course of the arc, effect a decrease in the current to the cathode constructed of the substrate material, while gradually increasing the current of the desired outer layer material. In this manner sharp gradients in the physical properties of the coating may be avoided.
3. Production of insulating coatings, in cases where the individual constituents of an alloy are conducting materials that can be fabricated into cathodes.
4. Production of laminated coatings composed alternatively of one material and then the other.

Another possibility is to combine the gas-alloying technique of FIG. 3 with the multi cathode technique of FIGS. 4a–4d e.g., to synthesize coatings composed of several elements normally found as solid conducting material, and other elements found normally as gases. In particular, there is considerable interest in fabricating BCN coatings for machine tool wear protection, which in principle should be possible by using cathodes fabricated from graphite and boron, with nitrogen as an alloying gas, as described above.

Figure 5:
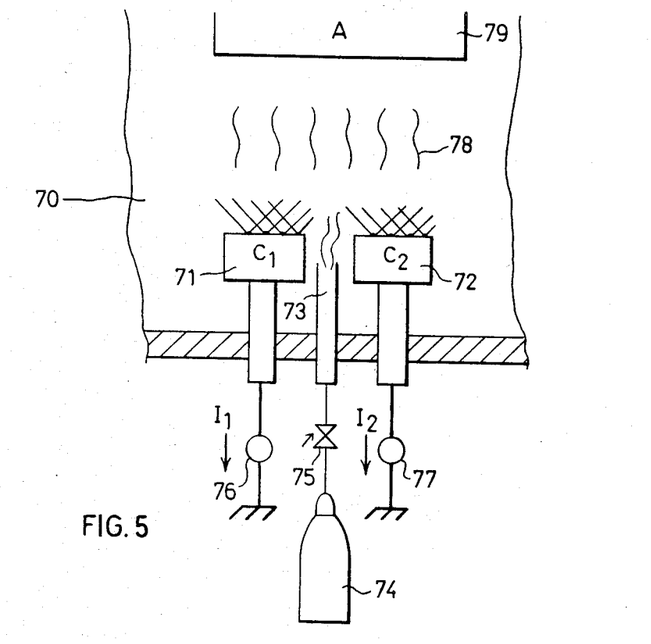
FIG. 5 illustrates a further apparatus in accordance with the invention for producing a coating consisting of a plurality of component materials on a substrate in accordance with the present invention.

FIG. 5 illustrates such an arrangement wherein the vacuum chamber 70 includes a plurality of cathodes 71 and 72 and an alloying gas supplied via an inlet conduit 73 from a gas supply 74 via a pressure regulator 75. Each of the two cathodes 71, 72 is individually energized by its current supply 76, 77. It will thus be seen that the two cathodes and the alloying gas have produced a combined material and gas flux in the gap 78 with the workpiece anode 79.

As one example, cathode 71 may be of titanium; cathode 72 may be of barium or magnesium; gas 74 may be oxygen; and anode 79 may be of copper, for producing barium titanate or magnesium titanate coatings for thin film capacitors.

Figure 6:
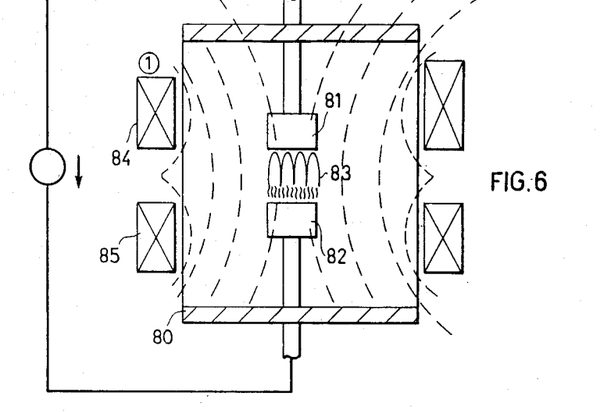
FIG. 6 illustrates a further embodiment of the invention which includes a magnetic field for collimating the plasma flow.

FIG. 6 illustrates a still further variation for obtaining better coating uniformity by producing a magnetic field axially of the gap between the workpiece anode and the cathode at the time of each electrical discharge to collimate the plasma flow. Thus, the apparatus in FIG. 6 includes a vacuum arc chamber 80 supporting a cathode 81 for the plasma source, and an anode 82 constituted of the workpiece to be treated, the two being separated by a gap 83. Magnetic field coils 84, 85 are disposed externally of the arc chamber 80 (but could also be internally), and are oriented so as to produce a magnetic field passing axially through gap 84. This magnetic field collimates the plasma flow and suppresses radial constriction of the electrical current flow near the workpiece anode, and thus ensures a more uniform heat flux. In the arrangement illustrated in FIG. 6, the workpiece anode 82 is located below the cathode 81 so that gravity will smooth out the molten surface of the anode and will thus avoid the formation of craters.

Figure 7:
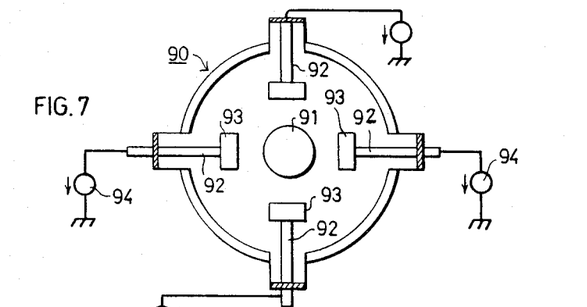
FIGS. 7a and 7b are end and longitudinal-sectional views, respectively, illustrating another form of apparatus constructed in accordance with the invention, particularly for treating long cylindrical workpieces.
Figure 7A:
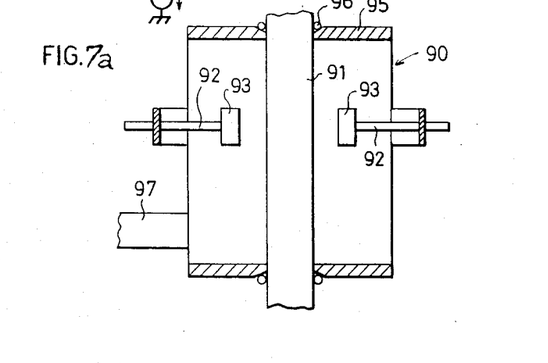

FIGS. 7 and 7a illustrate a still further variation which may be used for surface treating limited regions of a long cylindrical object, such as the bearing surface of a drive shaft. Thus, the apparatus illustrated in FIGS. 7 and 7a include a vacuum chamber 90 for establishing a vacuum ambient. The vacuum chamber is formed with openings for receiving the long cylindrical workpiece 91 to be treated, the workpiece serving as the anode. Arc chamber 90 further includes a plurality of supports 92 for supporting a plurality of cathodes 93 in an annular array around workpiece 91. Preferably, each of the cathodes 93 is provided with an individual current source 94, as shown in FIG. 7, to ensure equal distribution of current among the plurality of cathodes 93. By providing insulated feed-through flanges 95 and O-ring seals 96, workpieces 91 longer than the vacuum chamber 90 can be treated. The vacuum chamber is evacuated by a pumping system connected to port 97.

Figure 8:
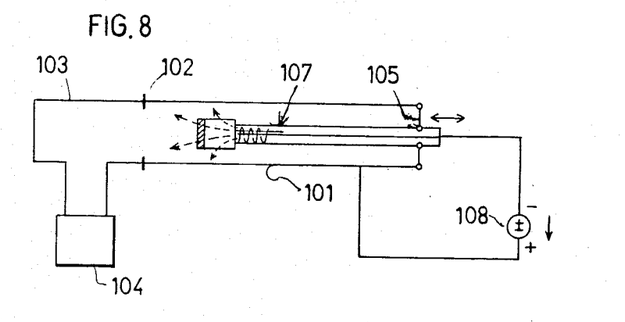
FIGS. 8–10 illustrate a still further apparatus for coating the inner surface of hollow, elongated articles.
Figure 9:
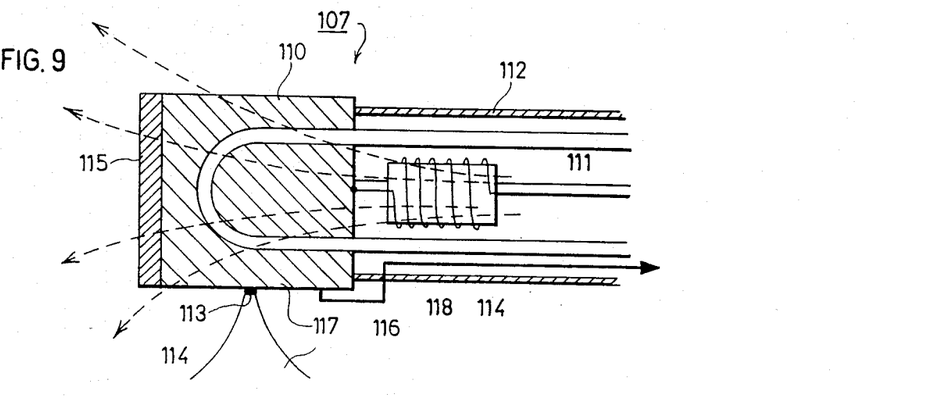
Figure 10:
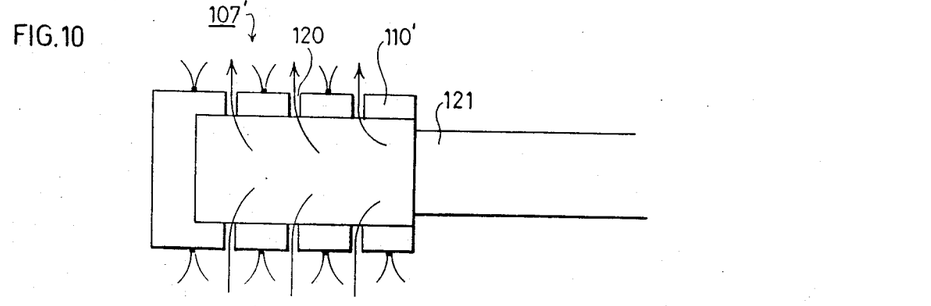

FIGS. 8–10 illustrate still further variations in the construction of apparatus which may be used for surface treating the inside surface of a long, hollow, cylindrical workpiece, such as the inside surface of a heat exchanger tube, gun barrel or the like.

Thus, as shown in FIG. 8, the workpiece 101, for example a gun barrel, serves as part of the vacuum chamber. One end is connected through an appropriate vacuum seal 102 and adaptor 103 to a vacuum pumping and monitoring system 104. The opposite end is closed by an end wall 105 formed with a sealed feed-through opening 106 receiving a cathode assembly 107 movable longitudinally within the workpiece. The workpiece 101 serves as the arc anode with respect to the movable cathode assembly 107. A power supply 108 connected between the workpiece anode 101 and the movable cathode assembly 107 supplies the power for producing the required high-current, short-duration pulses.

FIG. 9 illustrates one construction that may be used for the cathode assembly 107 in the apparatus of FIG. 8. Thus, the cathode assembly 107 may include an active cathode 110 supported at the end of an electrically-conductive rod 111. The latter also serves as the electrical connection to the cathode and extends through the sealed-through opening 105 (FIG. 8) at the end of the anode workpiece 101 to facilitate the manipulation of the cathode. Rod 111 is enclosed by an insulating tube 112, e.g. of glass or ceramic, to prevent arcing along its length.

Upon the application of the electrical pulses by power supply 108 (FIG. 8), high-current, short-duration arcing occurs between spots 113 on the cathode 110 and the workpiece anode 101, producing a plasma jet 114. The latter may be used for applying a metalurgical coating, a surface alloy, or a surface heat treatment, or may be used for surface etching the inside of the workpiece, as described above.

Preferably, the end of cathode 110 is covered by an insulating cap 115 to prevent arcing from the end of the cathode, and thereby to concentrate the cathode spots to the sides of the cathode as illustrated in FIGS. 8 and 9. In addition, the cathode assembly 107 may be provided with a trigger 116 for igniting the arc, a liquid coolant circuit 117 for cooling the cathode if prolonged continuous or high duty cycles are to be used, and/or a source for producing a magnetic field axially of the cathode assembly in order to help direct the plasma jets and to rotate the cathode spots around the sides of the cathode 110. FIG. 9 illustrates the magnetic field producing means in the form of a solenoid 118 oriented axially of the cathode, but it will be appreciated that a permanent magnet, or other magnetic field producing means such as illustrated in FIG. 5, could be used.

FIG. 10 illustrates a still further variation, wherein the cathode 110' of the cathode assembly 107' includes a gas flow circuit in order to introduce an alloying gas close to the cathode spots, as discussed above with respect to the apparatus illustrated in FIG. 3. For this purpose, the cathode 110' is of hollow construction and is formed with a plurality of exit openings 120 for the gas, the gas being introduced through an inlet 121.

The apparatus illustrated in FIGS. 8–10 may be operated as follows: The cathode assembly 107 (or 107') is inserted through the sealed-through opening 105 in the workpiece 101 and positioned longitudinally thereof in the region to which the treatment is to be applied, whereupon the arc pulse is initiated by the power supply 108 between the cathode assembly and the workpiece anode 101. Between arc pulses, the cathode assembly is moved to a new position by sliding it through the vacuum sealed-through opening 105, thus allowing the entire length of the workpiece or selected portions thereof, to be treated as desired.

While the apparatus illustrated in FIGS. 8–10, as well as other apparatus illustrated herein, is particularly useful for treating metals with high-current, short-duration pulses, it will be appreciated that such apparatus could also be used for treating the workpiece with direct current pulses. For example, in the apparatus illustrated in FIGS. 8–10, the D.C. arc could be initiated while the cathode assembly 107 (or 107') is at one end of the workpiece, the arcing being continued as the cathode assembly is axially moved to the other end of the workpiece, at which point the arc could be extinguished.

While the preferred embodiments described above used a charged capacitor bank as the current pulse source, and a range of current pulses varying in amplitude from 0.5 to 2.0 kA and HAFW from 0.65 to 75 ms, it will be appreciated that other means of generating the current pulse could be used, and that the range of current amplitude or duration could be varied. Other current sources could include an SCR phase controlled rectifier circuit, provided the voltage is sufficient for igniting and maintaining the arc. As discussed earlier, pulse durations from 10 ns to seconds (or even longer), and pulse amplitudes from 1 A to hundreds of kA's are, in principle, possible. The optimum choice of arc currentamplitude and duration will be dependent on the specific end use, and consideration must be taken of the substrate and electrode geometry and material, desired coating thickness, surface temperature and heat penetration. At the higher current range, precautions must be taken (geometry, application of axial magnetic field, etc.) to prevent anode spot formation, if this effect is not desired.

It will be further appreciated that, although a trigger electrode was employed in the embodiment of FIG. 2, other means of arc initiation may be used, e.g., drawing the arc with either the anode or a supplementary mechanical trigger electrode, laser triggering, electrically overstressing the anode-cathode gap, or using a trigger fuse wire. Once arc initiations has occurred, the same mechanism of action generally applies.

The embodiments described above with respect to, e.g. FIG. 2, utilize a simple geometry consisting of a pair of parallel electrodes, with the cathode serving as the source and the anode as the substrate. Numerous variations of the geometry are possible. The substrate geometry is dictated by the end use. There is no fundamental limitation on the substrate geometry, although it should be noted that the substrate geometry will quite likely influence the uniformity and other properties of the substrate. In addition, it is likely that portions of the substrate which are less connected thermally to the bulk of the substrate will heat up to higher temperatures than adjacent, flat, thick regions, which effect should be taken into account to prevent damage to the substrate.

Further, the cathode can be shaped to produce a particularly desired deposition or heat flow pattern, particularly in cases where the cathode is mounted in close physical proximity to the substrate, or where an axial magnetic field is used to encourage parallel plasma flow.

Many other variations, modifications and applications of the invention may be made.

What is claimed is:

1. The method of surface treating a workpiece, characterized in applying one or more short-duration electrical pulses to produce, for each pulse, a high-amplitude short-duration electrical discharge between said workpiece, serving as an anode, and another material serving as a cathode, while said workpiece and cathode are in a vacuum ambient.

2. The method according to claim 1, wherein said workpiece and cathode are spaced from each other by a gap which is less than the smallest dimension of said cathode in the plane therethrough parallel to said workpiece.

3. The method according to claim 1,
    wherein each of said pulses is applied for a duration (HAFW) of 0.5 to 100 ms.

4. The method according to claim 1,
    wherein each of said electrical discharges has a current density of at least $3 \cdot 10^6$ amps/m$^2$.

5. The method according to claim 1, wherein each of said electrical discharges has a current of at least 500 amps.

6. The method according to claim 5, wherein each of said electrical discharges has a current of from 500–2000 amps.

7. The method according to claim 1, wherein said cathode diameter is at least 10 mm., and said workpiece is spaced therefrom 1–8 mm.

8. The method according to claim 1, wherein the material of said cathode is applied as a surface coating to said workpiece, the surface of the workpiece being heated by said electrical discharge above the melting point of the cathode material, but below the melting point of the workpiece material.

9. The method according to claim 1, wherein the material of said cathode is applied as a surface coating to said workpiece, the surface of the workpiece being heated by said electrical discharge sufficiently to promote interdiffusion of, and thereby adhesion between, said workpiece and said cathode coating.

10. The method according to claim 1, wherein the material of said cathode is applied as a surface coating to said workpiece, the surface of said workpiece being heated by said electrical discharge above the melting point of the cathode material and of the workpiece material, thereby producing an alloy of the two materials on the surface of the workpiece.

11. The method according to claim 1, wherein the surface of said workpiece is heated by said electrical discharge beyond its solid phase transformation temperature and then is allowed to rapidly cool through natural solid conduction into the bulk of the workpiece material, thereby quenching the regions near the surface of the workpiece to induce metastable crystalline structure.

12. The method according to claim 1, wherein each of said electrical discharges is produced only at selected areas of the workpiece surface.

13. The method according to claim 1, wherein each of said electrical discharges is initiated by a triggering device.

14. The method according to claim 1, wherein an alloying gas is present in said vacuum ambient at the time of each of said electrical discharges.

15. The method according to claim 1, wherein each of said electrical discharges is produced between said workpiece and a plurality of cathodes, the latter producing a plurality of plasma beams which merge at the surface of said workpiece.

16. The method according to claim 1, wherein a magnetic field is produced axially of the gap between said workpiece and cathode at the time of each of said electrical discharges to collimate the plasma flow between the workpiece and cathode.

17. The method according to claim 1, wherein the workpiece is of a long cylindrical configuration, and there are a plurality of said cathodes disposed around said cylindrical workpiece.

18. The method according to claim 1, wherein there are a plurality of cathodes of different materials closely spaced to said workpiece, there being at least one short-duration, high-amplitude electrical pulse sequentially applied between each cathode and the workpiece to produce on the workpiece successive coatings of the different cathode materials.

19. The method according to claim 1, wherein said workpiece is of long, hollow configuration, and said cathode is disposed within said workpiece to treat the inner surface thereof.

20. The method according to claim 19, wherein the cathode is moved along the length of the long, hollow workpiece to treat different portions of the inner surface thereof.

21. The method according to claim 19, including the further step of introducing an alloying gas into said chamber between the cathode and workpiece.

22. The method of surface treating a long, hollow workpiece comprising: disposing said workpiece in a vacuum chamber; disposing a cathode within said workpiece; and applying electrical pulses between said cathode and said workpiece to produce electrical discharges therebetween, the workpiece serving as an anode.

23. Apparatus for surface-treating a workpiece, comprising: a vacuum chamber; first support means for supporting the workpiece in said vacuum chamber to serve as an anode; second support means for supporting another material in said vacuum chamber to serve as a cathode; and means for applying short-duration electrical pulses between said workpiece and said cathode to produce, for each pulse, a high-amplitude, short-duration electrical discharge therebetween.

24. Apparatus according to claim 23, wherein said first and second support means are spaced from each other to support said workpiece and cathode spaced from each other by a gap which is less than the smallest dimension of the cathode in the plane therethrough parallel to the workpiece.

25. Apparatus according to claim 24, wherein said first and second support means are spaced from each other to support said workpiece and cathode spaced from each other by a gap which is no more than 8 mm.

26. Apparatus according to claim 23, further including a triggering device for initiating the electrical discharges.

27. Apparatus according to claim 23, further including means for introducing an alloying gas into said vacuum chamber at the time of each electrical discharge.

28. Apparatus according to claim 27, wherein said cathode is formed with a hollow cavity in its interior, and with a plurality of holes connecting said cavity with the cathode surface normally facing the workpiece, said apparatus further including means providing a regulated gas flow to said cavity and to said holes of the cathode such that the gas may be injected in close proximity to cathode spots formed of the surface of the cathode and thus produce a combined plasma flow of the gas mixed with the material from the cathode.

29. Apparatus for surface-treating a workpiece, comprising: a vacuum chamber; first support means for supporting the workpiece in said vacuum chamber to serve as an anode; a cathode having a hollow cavity in its interior, and a plurality of holes connecting said cavity with the cathode surface normally facing the workpiece; and means providing a regulated gas flow to said cavity and said plurality of holes of the cathode such that the gas may be injected in close proximity to cathode spots formed on the surface of the cathode and thus produce a combined plasma flow of the gas mixed with the material from the cathode.

30. Apparatus according to claim 29, wherein said second support means supports a plurality of cathodes to produce a plurality of plasma beams which merge at the surface of the workpiece.

31. Apparatus according to claim 29, further including means for producing a magnetic field axially of the gap between said workpiece and cathode at the time of each of said electrical discharges to collimate the plasma flow between the workpiece and cathode.

32. Apparatus according to claim 29, wherein said first support means is adapted to support a workpiece of long, hollow configuration, and said second support means is adapted to support a cathode within such long, hollow workpiece.

33. Apparatus for treating the inner surface of a workpiece of long, hollow configuration comprising: a vacuum chamber; first support means for supporting the workpiece in said vacuum chamber to serve as an anode; second support means for supporting a cathode at selected locations within said long, hollow workpiece; and means for applying electrical pulses between said workpiece and said cathode to produce electrical discharges therebetween.

34. Apparatus according to claim 33, wherein said second support means includes means for moving the cathode along the length of the long, hollow workpiece to treat different portions of its inner surface.

35. Apparatus according to claim 33, wherein said first support means supports the long cylindrical workpiece such that it can protrude from the ends of the vacuum chamber via vacuum seals; said apparatus including an array of cathodes disposed around the circumference of the workpiece at a selected longitudinal location thereon; and current supply means for equally distributing the current among said plurality of cathodes.

36. Apparatus for treating the inner surface of selected longitudinal regions of a long cylindrical workpiece, comprising: a vacuum chamber; means for supporting said long cylindrical workpiece in said vacuum chamber with its ends protruding therefrom via vacuum seals; an array of cathode assemblies disposed around the circumference of the workpiece at a selected longitudinal location thereon; and a current supply providing current to said plurality of cathodes so as to produce electrical discharges between said plurality of cathodes so as to produce electrical discharges between said plurality of cathodes and said workpiece serving as an anode.

37. Apparatus according to claim 36 further including means for introducing an alloying gas into said chamber between the cathode and the long, cylindrical workpiece.

* * * * *